United States Patent
Wittlinger

(10) Patent No.: US 6,788,229 B1
(45) Date of Patent: Sep. 7, 2004

(54) MARGINING PIN INTERFACE CIRCUIT FOR CLOCK ADJUSTMENT OF DIGITAL TO ANALOG CONVERTER

(75) Inventor: Harold Allen Wittlinger, Pennington, NJ (US)

(73) Assignee: Intersil Americas Inc., Milpitas, CA (US)

( * ) Notice: Subject to any disclaimer, the term of this patent is extended or adjusted under 35 U.S.C. 154(b) by 4 days.

(21) Appl. No.: 10/389,374

(22) Filed: Mar. 14, 2003

(51) Int. Cl.[7] .......................... H03M 1/00; H03M 1/10
(52) U.S. Cl. ..................................... 341/120; 341/135
(58) Field of Search .............................. 341/120, 118, 341/143, 144, 135; 327/175, 365; 331/10; 330/2; 716/8

(56) References Cited

U.S. PATENT DOCUMENTS

| | | | |
|---|---|---|---|
| 4,929,918 A | * | 5/1990 | Chung et al. ............... 331/10 |
| 5,130,565 A | * | 7/1992 | Girmay ..................... 327/175 |
| 5,508,650 A | | 4/1996 | Grimm et al. |
| 5,729,230 A | * | 3/1998 | Jensen et al. .............. 341/143 |
| 6,286,127 B1 | | 9/2001 | King et al. |
| 6,313,776 B1 | * | 11/2001 | Brown ........................ 341/144 |
| 6,424,211 B1 | | 7/2002 | Nolan et al. |
| 6,509,771 B1 | * | 1/2003 | Atallah et al. .............. 327/175 |
| 6,593,789 B2 | * | 7/2003 | Atallah et al. .............. 327/175 |

* cited by examiner

Primary Examiner—Patrick Wamsley
(74) Attorney, Agent, or Firm—Allen, Dyer, Doppelt, Milbrath & Gilchrist, P.A.

(57) ABSTRACT

A voltage margin setting interface circuit has a single input pin, and is configured to program the slew rate and polarity direction of variation of the operation of a digital-to-analog converter, such as may be used to set a reference voltage level, for application to an error amplifier of a voltage regulator circuit of the power supply of a personal computer. A DAC clocking control circuit is coupled to an output port, and to respective DAC increment and decrement ports, and is operative to control the magnitude of output current, and to assert an output signal at one of the increment and decrement ports, in accordance with a prescribed relationship between the voltage and upper and lower ranges of the input voltage relative to its middle value.

20 Claims, 1 Drawing Sheet

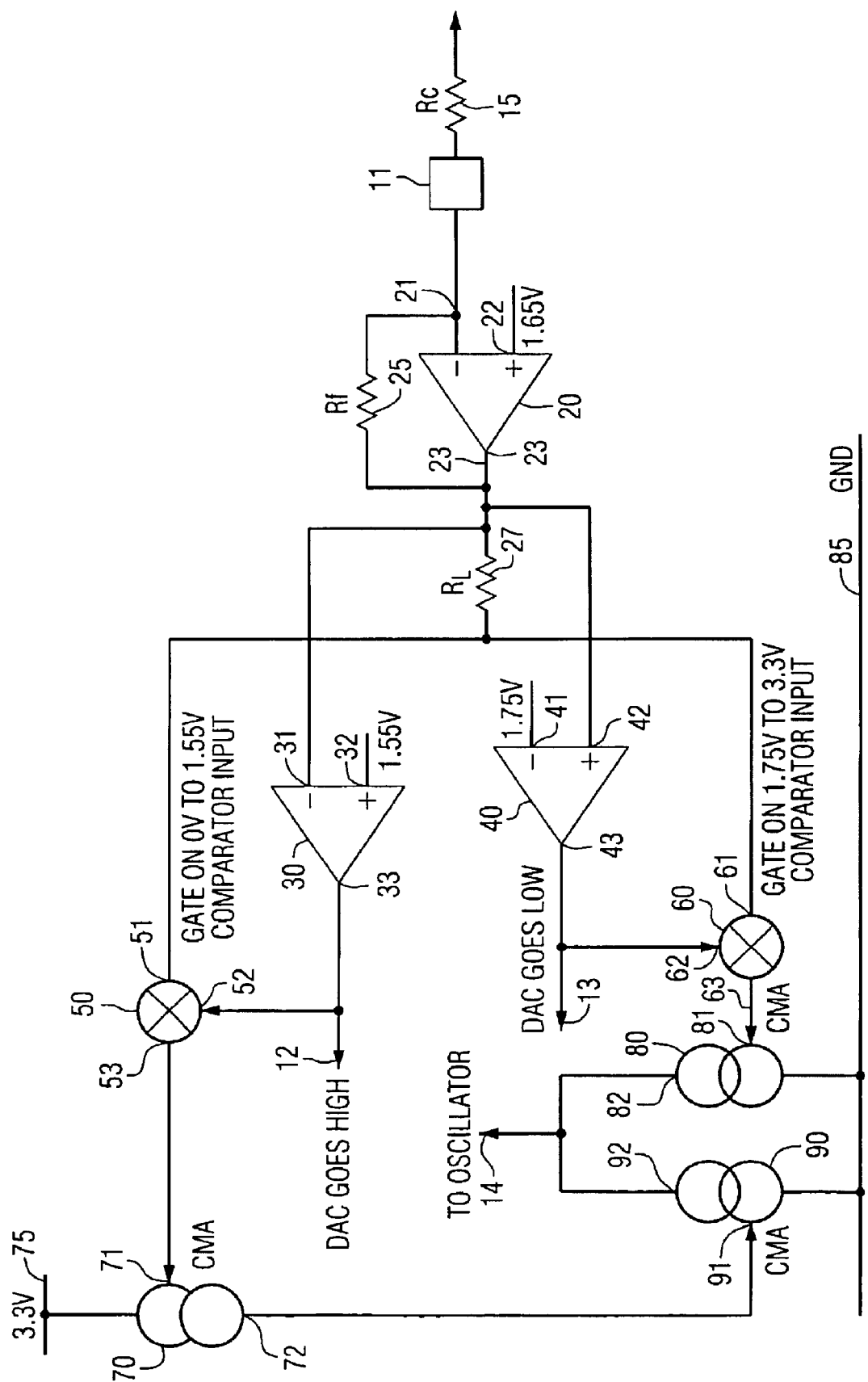

MARGINING PIN INTERFACE CIRCUIT FOR CLOCK ADJUSTMENT OF DIGITAL TO ANALOG CONVERTER

FIELD OF THE INVENTION

The present invention relates to voltage level control circuits, and is particularly directed to a voltage margin setting interface circuit having a single input pin, and being operative to program the slew rate and polarity direction of variation of the operation of a digital-to-analog converter (DAC), such as may be used to set a reference voltage level, for application to an error amplifier of a voltage regulator circuit of the power supply for a microprocessor.

BACKGROUND OF THE INVENTION

The technique of varying the voltage to various controller integrated circuits is termed 'power margining'. This technique has become increasingly important for the portable computer market, where the processor voltage is controllably increased depending upon operational demands. For example, the power may be decreased during low processing requirements, to result in a reduction in standby power. In a complementary manner, when there is a need for faster signal processing, for example, in graphics processing applications, processor speed must be increased to handle rapid or complex display changes. Associated with this increase in processor speed, the supply voltage is also increased to accommodate temporary high performance and power demands. On the other hand, when there is no need for speed, the power to the processor is reduced by way of a lower processor voltage, resulting in improved power supply economy.

SUMMARY OF THE INVENTION

With this objective in mind, the present invention is directed to a new and improved power margining interface, that is configured to provide on-demand adjustment, by means of a single input pin, of a reference voltage supplied by a digital-to-analog converter (DAC). For this purpose, the invention has an input port, to which an input or control voltage is supplied by way of an input scaling resistor, which converts the input voltage to an input current. This input current is coupled to an operational amplifier, which may be configured as an inverting unity gain buffer, referenced to a voltage midway between the range of input voltage variation.

The output of the operational amplifier is coupled through an output resistor to a pair of transmission gates. It is also directly coupled to an 'increment DAC' comparator and to a 'decrement DAC' comparator. These comparators control whether the DAC is either incremented or decremented, and also controllably close one of the transmission gates, and thereby steer a control current to a clock oscillator that clocks the DAC, with the absolute value of the control current defining the slew rate of the DAC.

The 'increment DAC' comparator operates so as to controllably increment the DAC in response to the comparator input voltage lying within a lower portion of the input voltage range, which is at least a prescribed offset above the voltage reference of the operational amplifier. Conversely, the 'decrement DAC' comparator operates so as to controllably cause the DAC to be decremented, in response to the comparator input voltage lying within an upper portion of the input voltage range that is at least the prescribed offset below the voltage reference of the operational amplifier.

The output of the increment comparator is coupled to a control input of one transmission gate and to a first output port which is coupled to the increment control input of the DAC. The output of the other comparator is coupled to a control input of the other transmission gate and to a second output port, which is coupled to the decrement input of the DAC. The outputs of the transmission gates are coupled to current mirror amplifiers that are configured to provide an output current that is the absolute value of their input currents.

In operation, as long as the input voltage is within the prescribed voltage offset, neither comparator is triggered and the margining pin interface circuit has no effect on the operation of the DAC, and the reference voltage delivered thereby. When it is desired to increase the reference voltage from the DAC, the input port to the respective comparator is supplied with a voltage having a value that is at least equal to the prescribed offset below the reference voltage. This causes the output of the 'increment DAC' comparator to change state, which places the DAC in increment mode, and causes so the DAC's reference voltage to be incremented at a clock rate that is determined by the value of the current being supplied by the absolute value circuit. The closer the input voltage to the 'increment DAC' comparator is to the lower end of the voltage range (namely the larger the difference between the input voltage and reference voltage to the 'increment DAC' comparator), the larger the current supplied to the absolute value circuit, causing the frequency of the clock rate for the DAC to be decreased by a relatively large amount. The absolute value circuit is configured to "sink" current from the oscillator, thus reducing oscillator frequency. On the other hand, the closer the input voltage is to the midpoint of the voltage range, the smaller the current supplied to the absolute value circuit, so that the clock rate for the DAC will be decreased by a relatively slower amount.

When it is desired to decrease the reference voltage supplied by the DAC, the input port of the comparator is supplied with a voltage that is the prescribed voltage above the reference voltage. This causes the output of the 'decrement DAC' comparator to change state, which places the DAC in the decrement mode, and causes the output reference voltage to be decremented at a clock rate determined by the value of the current being supplied by the absolute value circuit. The closer the input voltage is to the upper end of the voltage range (namely the larger the difference between the input voltage and the reference voltage to the 'decrement DAC' comparator), the larger the current supplied to the absolute value circuit, so that the DAC's clock frequency will be decreased by a relative large amount. On the other hand, the closer the input voltage is to the midpoint of the voltage range, the smaller the current supplied to the absolute value circuit, causing the DAC's clock to be decreased by a relatively small amount.

BRIEF DESCRIPTION OF THE DRAWINGS

The single FIGURE illustrates the circuit configuration of a margining pin interface circuit in accordance with the invention.

DETAILED DESCRIPTION

An integrated circuit implementation of the margining pin interface circuit in accordance with a preferred embodiment of the present invention is shown in FIG. 1 as comprising an input port 11, to which an input voltage is supplied through an input resistor 15, which may be external to the integrated circuit. Resistor 15 converts the input voltage to an input current for application to input port 11. Input port 11 is coupled to a first, inverting (−) input 21 of an operational amplifier 20, a second, non-inverting (+) input 22 of which is coupled to a prescribed reference voltage, which is midway between the range of input voltages that may be supplied to input port 11. For purposes of providing a non-limiting example, the input voltage may range from zero (0) volts to +3.3 VDC, so that the prescribed reference potential may be set at +1.65 VDC. Coupled between the inverting (−) input 21 and an output port 23 of operational amplifier 20 is a feedback resistor 25, which may be set equal to that of the input resistor 15, so that amplifier 20 operates as a unity gain inverting amplifier.

Amplifier output port 23 is coupled through a current scaling resistor 27 to inputs 51 and 61 of respective transmission gates 50 and 60. Resistor 27 is used to set the rate of change or slew rate of a DAC voltage to be controlled by the margining pin interface circuit. As non-limiting examples, the transmission gates may be implemented using FET or bipolar devices. Amplifier output port 23 is also directly coupled to the inverting (−) input 31 of a first, 'increment DAC' comparator 30, and to the non-inverting (+) input 42 of a second, 'decrement DAC' comparator 40. The comparators 30 and 40 are used to control whether the DAC is either incremented or decremented, and also controllably close one of the transmission gates, and thereby steer a control current to a clock oscillator that clocks the DAC, with the absolute value of the control current controlling the slew rate of the DAC.

More particularly, the first, 'increment DAC' comparator 30 operates so as to controllably cause the clock frequency of the DAC to be decreased, in response to the input voltage supplied to input port 11 lying within a lower portion of the input voltage range that is a prescribed offset value (e.g., on the order of at least 100 mV) below its midpoint (in the present example, +1.65 volts of the present example, or between 0 and +1.55 VDC); on the other hand, 'decrement DAC' comparator 40 operates so as to controllably cause the DAC's clock frequency to be deceased, in response to the input voltage lying within an upper portion of the input voltage range that is the prescribed offset above its midpoint (or between +1.75 volts and +3.3 volts, in the present example).

For this purpose, comparator 30 has its non-inverting (+) input 32 coupled to receive a reference voltage of +1.55 volts, while comparator 40 has its inverting (−) input 41 coupled to receive a reference voltage of +1.75 volts. The output 33 of comparator 30 is coupled to control input 52 of the transmission gate 50 and to a first 'increment DAC' output port 12, which is coupled to an 'increment clock' control input of the DAC. Output 43 of comparator 40 is coupled to control input 62 of transmission gate 60 and to a second, 'decrement DAC' output port 13, which is coupled to the 'decrement clock' input of the DAC.

Transmission gate 50 has its output 53 coupled to the input 71 of a first current mirror amplifier (CMA) 70, which is referenced to the positive voltage rail 75 (e.g., +3.3 volts), while the output 63 of transmission gate 60 is coupled to the input 81 of a second CMA 80, which is referenced to ground (GND) voltage 85. CMA 80 has its output 82 coupled to a third output port 14, which supplies an output current representative of the magnitude of the change to be imparted to the DAC's clock. Current mirror amplifiers are highly accurate and precisely reflect their input current. As a non-limiting example, the current mirror amplifiers 70, 80 and 90 may be configured as a classical Wilson current mirror, or that described in the U.S. Patent to Wittlinger, U.S. Pat. No. 3,835,410. Also the input/output ratios of the current mirrors may be 1:1. CMA 70 has its output 72 coupled to the input 91 of a third CMA 90, which is referenced to the ground voltage rail 85. CMA 90 has its output 92 coupled to the third output port 14.

The margining pin interface circuit of the Figure operates as follows. In the configuration shown, operational amplifier 20 is connected as a current converter that is referenced to the midpoint of the input voltage range, or 1.65 volts in the present example, as described above. As long as the input voltage applied to the input port 11 is within +/−100 mv of this midpoint value, neither comparator 30 or 40 trips and the margining pin interface circuit has no effect on the operation of the DAC to which its outputs 12, 13 and 14 are coupled.

When it is desired to increase the reference voltage supplied by the DAC, input pin 11 is coupled to receive a voltage that is at least 100 mv above the midpoint value (namely, within the lower range of 1.75 to 3.3 volts). In response thereto, the output of the 'increment DAC' comparator 30, which is applied to the 'increment DAC' output port 12 and to the control port 52 of transmission gate 50, changes state. With the change in state of the 'increment DAC' output port 12, the DAC's clock is decreased at a rate governed by the absolute value of the current being supplied by output port 14. The current delivered by output port 14 may be coupled into a resistor to generate a voltage for controlling a voltage controlled oscillator used to clock the DAC.

As pointed out above, the value of this clock control current depends upon the magnitude of the current being coupled through output resistor 27 to the input 51 of transmission gate 50, which is closed by the change in state of the output 33 of the 'increment DAC' comparator 30, and applied to the transmission gate's control input 52. Current mirror amplifiers 70 and 90 function to deliver to output port 14 an output current that is the absolute value of this current. The larger the difference between the input voltage and the reference voltage to the 'increment DAC' comparator 30, namely the closer the input voltage is to the lower end of the voltage range (zero volts in the present example), then the larger the current flowing through output resistor 27. This is reflected by a relatively large output current being mirrored by current mirrors 70 and 90 to output port 14, so that the DAC's clock will undergo a relatively high rate of change in frequency. On the other hand, the closer the input voltage is to the midpoint of the voltage range (1.65 volts in the present example), then the smaller the current flowing through resistor 27. This is reflected by a relatively small output current being mirrored by current mirrors 70 and 90 to output port 14, so that the DAC clock frequency will undergo a relatively small change.

In a complementary manner, in response to the input voltage to resistor 15 being at least 100 mv below the midpoint value of 1.65 volts (namely, falling in the lower range of from 0 to 1.55 volts), the output of the 'decrement DAC' comparator 40, which is applied to the 'decrement DAC' output port 13 and to the control port 62 of transmission gate 60, changes state. With the change in state of the 'decrement DAC' output port 13, the DAC's clock frequency is decreased by an amount that is determined by the absolute value of the output current supplied by output port 14. The value of this current depends upon the magnitude of the current being coupled through resistor 27 to the input 61 of transmission gate 60, which is closed by the change in state of the output 43 of the 'increment DAC' comparator, and applied to the transmission gate's control input 62.

Thus, in a manner similar to the 'increment DAC' operation, described above, the closer the input voltage to resistor 11 is to the lower end of the voltage range (0 volts in the present example), then the larger the current flowing through output resistor 27. This is reflected by a relatively large output current being mirrored by current mirror amplifier 80 to output port 14, causing the DAC's clock frequency to be decreased by a relatively large amount. On the other hand, the closer the input voltage is to the midpoint of the voltage range (+1.65 volts in the present example), then the smaller the current flowing through output resistor 27. This is reflected by a relatively small output current being mirrored by current mirror 80 to output port 14, so that the DAC's clock frequency will undergo a relatively small decrease.

As will be appreciated from the foregoing description, the margining interface circuit of the invention provides for both incrementing or decrementing of a reference voltage produced by a digital-to-analog converter at a controllable slew rate, depending on the magnitude of the input voltage applied to a single pin. As such, the invention allows the reference voltage to be changed, on demand, to either a higher or lower value, making the invention readily suited to the supply and adjustment of a reference voltage, such as that supplied to an error amplifier of a voltage regulator circuit of the power supply of a personal computer.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A circuit for controlling the operation of a digital-to-analog converter (DAC) comprising:
    an input port to which an input voltage is coupled;
    an output port from which an output current that is adapted to control the clock frequency of the:DAC is provided;
    a DAC clock adjustment circuit, coupled to said output port, and being coupled between said input port and respective increment and decrement ports, that are adapted to be coupled to associated increment and decrement clock control inputs of said DAC, said DAC clock adjustment circuit being operative to control said output current, and to assert an output signal at one of said increment and decrement ports, in accordance with a prescribed relationship between the value of said input voltage and a range of variation thereof.

2. The circuit according to claim 1, wherein said DAC clock adjustment circuit is operative to cause said output current to have a relatively large value, in response to said input voltage being proximate to either of opposite ends of said range of variation, and to cause said output current to have a relatively small value, in response to said input voltage being proximate to a prescribed reference voltage within said range of variation.

3. The circuit according to claim 2, wherein said prescribed reference voltage corresponds to a midpoint of said range of variation.

4. The circuit according to claim 3, wherein said DAC clock adjustment circuit includes an operational amplifier coupled to said input port and referenced to said prescribed reference voltage, and having an output, an increment comparator and a decrement comparator coupled to said output of said operational amplifier, said increment comparator being referenced to a first voltage proximate to said prescribed reference voltage, said decrement comparator being referenced to a second voltage different from said first voltage and proximate to said prescribed reference voltage, said increment comparator having an output thereof coupled to said increment port DAC and said decrement comparator having an output thereof coupled to said decrement DAC port.

5. The circuit according to claim 4, wherein said DAC clock adjustment circuit includes an absolute value circuit that is responsive to said output of said operational amplifier, and is operative to define the value of said output current.

6. The circuit according to claim 5, wherein said absolute value circuit is comprised of a plurality of current mirror amplifiers coupled between said output of said operational amplifier and said output port, and being selectively controlled in accordance with said output signal as asserted at said one of said DAC increment and DAC decrement ports.

7. The circuit according to claim 1, wherein said DAC clock adjustment circuit is operative to assert an output signal at said increment DAC port, in response to said input voltage falling within a first portion of said range of variation of said input voltage, and to assert an output signal at said decrement DAC port, in response to said input voltage falling within a second portion of said range of variation of said input voltage.

8. The circuit according to claim 7, wherein said DAC clock adjustment circuit is operative to cause said output current to have a relatively large value, in response to said input voltage being proximate to either of opposite ends of said range of variation of said input voltage, and to cause said output current to have a relatively small value, in response to said input voltage being proximate to a midpoint of said range of variation of said input voltage.

9. The circuit according to claim 8, wherein said DAC clock adjustment circuit includes an absolute value circuit that is operative to define the value of said output current.

10. A method of controlling the operation of a digital-to-analog converter (DAC) comprising the steps of:
    (a) providing an input port;
    (b) providing an output port from which an output current that controls the clock frequency of the DAC is derived;
    (c) providing respective DAC increment and DAC decrement ports that are adapted to be coupled to associated increment and decrement control inputs of said DAC; and
    (d) controlling the magnitude of said output current and selectively asserting an output signal at one of said DAC increment and decrement DAC ports, in accordance with a prescribed relationship between the value of said input voltage and a range of variation thereof.

11. The method according to claim 10, wherein step (d) comprises asserting said output signal at said increment port, in response to said input voltage falling within said first range of said input voltage, and asserting said output signal at said decrement port, in response to said input voltage falling within said second range of said input voltage.

12. The method according to claim 11, wherein step (d) comprises causing said output current to have a relatively large value, in response to said input voltage being proximate to opposite ends of said first and second ranges of said input voltage, and causing said output current to have a relatively small value, in response to said input voltage being proximate to a prescribed reference voltage within said range of variation.

13. The method according to claim 12, wherein step (d) comprises coupling an operational amplifier to said input port and referencing said operational amplifier to a prescribed voltage, coupling an increment DAC comparator and a decrement DAC comparator to said output of said operational amplifier, said increment comparator being referenced to a first voltage proximate to said prescribed voltage, said decrement DAC comparator being referenced to a second voltage different from said first voltage and proximate to said prescribed voltage, said increment DAC comparator having an output thereof coupled to said increment DAC port and said decrement comparator DAC amplifier having an output thereof coupled to said decrement DAC port.

14. The method according to claim 13, wherein step (d) comprises controlling the magnitude of said output current in accordance with the absolute value of the current output of said operational amplifier.

15. The method according to claim 14, wherein step (d) comprises coupling a plurality of current mirror amplifiers between said output of said operational amplifier and said output port, and selectively controlling a current path through said current mirror amplifiers in accordance with said output signal as asserted at said one of said increment DAC port and said decrement DAC port.

16. The method according to claim 12, wherein said prescribed reference voltage corresponds to a midpoint of said range of variation.

17. The method according to claim 10, wherein step (d) comprises causing said output current to have a relatively large value, in response to said input voltage being proximate to either of opposite ends of range of variation of said input voltage, and causing said output current to have a relatively small value, in response to said input voltage being proximate to
adjacent ends of said first and second ranges of said input voltage.

18. A circuit for determining the relationship between and input voltage and a reference voltage comprising:

an input port to which an input voltage is coupled;

first, second and third output ports;

a comparator circuit, coupled between said input port and said first, second and third output ports, and being operative to assert an output signal at said first output port in response to said input voltage being higher than said reference voltage, and being operative to assert an output signal at said second output port in response to said input voltage being less than said reference voltage, and to supply to said third output port an output current representative of the difference between said input voltage and said reference voltage.

19. The circuit according to claim 18, wherein said comparator circuit is operative to cause said output current to have a relatively large value, in response to said input voltage being proximate to either of opposite ends of said range of variation of said input voltage, and to cause said output current to have a relatively small value, in response to said input voltage being proximate to a midpoint of said range of variation of said input voltage.

20. The circuit according to claim 19, wherein said comparator circuit includes an operational amplifier coupled to said input port and referenced to said reference voltage, and having an output, a first comparator and a second comparator coupled to said output of said operational amplifier, said first comparator being referenced to a first voltage proximate to said reference voltage, said second comparator being referenced to a second voltage different from said first voltage and proximate to said reference voltage, said first comparator having an output thereof coupled to said first output port and said second comparator having an output thereof coupled to said second output port.

* * * * *